United States Patent [19]

Akutsu et al.

[11] Patent Number: 5,717,482
[45] Date of Patent: Feb. 10, 1998

[54] STAGE APPARATUS AND METHOD OF MOUNTING A SUBSTRATE ON A SUBSTRATE HOLDING SURFACE OF A SUBSTRATE CHUCK IN WHICH A SUBSTRATE IS MOUNTED IN A Z-AXIS DIRECTION

[75] Inventors: Kotarao Akutsu, Soka; Eiji Osanai, Yokohama, both of Japan

[73] Assignee: Canon Kabushiki Kaisha, Tokyo, Japan

[21] Appl. No.: 807,735

[22] Filed: Feb. 27, 1997

Related U.S. Application Data

[63] Continuation of Ser. No. 389,771, Feb. 16, 1995, abandoned.

[30] Foreign Application Priority Data

Feb. 18, 1994 [JP] Japan .................. 6-043260

[51] Int. Cl.$^6$ .................. G03B 27/42
[52] U.S. Cl. .................. 355/53; 356/400
[58] Field of Search .................. 355/18, 53, 54; 356/399, 400, 401

[56] References Cited

U.S. PATENT DOCUMENTS

| | | | |
|---|---|---|---|
| 4,648,708 | 3/1987 | Kosugi | 355/53 |
| 4,708,465 | 11/1987 | Isohata et al. | 355/53 |
| 4,775,877 | 10/1988 | Kosugi et al. | 355/53 |
| 4,814,830 | 3/1989 | Isohata et al. | 355/54 |
| 4,869,481 | 9/1989 | Yabu et al. | 269/21 |
| 5,040,431 | 8/1991 | Sakino et al. | 74/479 |
| 5,280,677 | 1/1994 | Kubo et al. | 33/568 |

*Primary Examiner*—Fred L. Braun
*Attorney, Agent, or Firm*—Fitzpatrick, Cella, Harper & Scinto

[57] ABSTRACT

A stage apparatus and method of mounting a substrate on a substrate holding surface of a substrate chuck in which a substrate is mounted in a Z-axis direction. The stage apparatus includes a movable stage, which is movable on an X-Y plane, a substrate stage mounted on the movable stage to be movable at least in a Z-axis direction, a substrate chuck which is arranged on the substrate stage for holding a substrate and a substrate support device, which is brought into contact with the substrate on the chuck and receives the substrate when the substrate stage moves in the Z-axis direction. The substrate support device includes a substrate supporting number arranged on the movable stage and the substrate stage has an opening through which the substrate supporting member can pass. A contact surface of the substrate chuck is located above a substrate contact surface of the substrate supporting member upon movement of the substrate stage. The substrate stage is lowered in the Z-axis direction and the substrate held by the substrate chuck is transferred from the substrate chuck onto the substrate supporting member in the process of moving the substrate stage.

9 Claims, 4 Drawing Sheets

STAGE APPARATUS AND METHOD OF MOUNTING A SUBSTRATE ON A SUBSTRATE HOLDING SURFACE OF A SUBSTRATE CHUCK IN WHICH A SUBSTRATE IS MOUNTED IN A Z-AXIS DIRECTION

This application is a continuation of application Ser. No. 08/389,771, filed Feb. 16, 1995, now abandoned.

BACKGROUND OF THE INVENTION

1. Field of the Invention

The present invention relates to a stage apparatus having a substrate attaching/detaching mechanism for replacement of a substrate such as a wafer or reticle and used for a semiconductor exposure apparatus or the like.

2. Related Background Art

FIG. 5 is a sectional view showing a semiconductor exposure apparatus including a wafer stage apparatus having a wafer attaching/detaching mechanism. This semiconductor exposure apparatus is constituted by a wafer stage apparatus 100 and a main body apparatus 200. The Z-axis is the exposure optical axis direction, and the X-Y plane is perpendicular to the exposure optical axis. The wafer stage apparatus 100 mainly consists of a tilt stage 1 and an X-Y stage 6. A chuck 2 is fixed to the tilt stage 1. The chuck 2 has a vacuum chuck mechanism 15 and serves to mount a wafer 3. A guide 4 restricts only the horizontal movement of the tilt stage 1. For example, with the use of a static pressure bearing, the guide 4 allows movement of the tilt stage 1 in the Z direction, the inclination direction, and the Z-axis rotation direction. The position of the tilt stage 1 in the Z direction as the gravity direction with reference to the X-Y stage 6 or the inclination of the tilt stage 1 can be automatically controlled at a high speed by noncontact driving of a plurality of Z linear motors 5 (5a and 5b). The X-Y stage 6 can be translated with respect to the main body apparatus 200 by a driving means such as a linear motor or a ball screw. A laser interferometer 9 can accurately measure the X-direction, Y-direction, and Z-axis-rotation-direction positions of a position measuring mirror 7b arranged on the tilt stage 1. The tilt stage 1 can be positioned in the X, Y, and Z-axis rotation directions with high precision by driving the X-Y stage 6 using the laser interferometer 9.

A wafer pin 10, which is a bar-shaped member having a hollow portion, has a vacuum mechanism 11. A secondary gear 13 and a bearing 14 for wafer pin 10 are arranged under the wafer pin 10. The wafer pin 10, the secondary gear 13, and the bearing 14 constitute a pin unit 30, which can move in the Z direction or Z-axis rotation direction with respect to the X-Y stage 6 via a ball bush 16. A lift mechanism 32 is constituted by a lever 20, a lever support base 21, and a direct drive motor 22 with a ball screw. The pin unit 30 is driven in the Z direction (vertically) via the lever 20 by the direct drive motor 22. A rotating mechanism 31 is constituted by a motor 19 and a primary gear 18. The pin unit 30 is driven by the motor 19 in the Z-axis rotation direction via the primary and secondary gears 18 and 13.

The main body apparatus 200 includes a wafer surface focus measuring instrument 201 used in a wafer exposure process, a wafer surface focus measuring instrument 202 used for pre-alignment after wafer replacement, and a hand mechanism 203 operated for wafer replacement. 10 In an exposure process, the pin unit 30 is located at the lowest position and is not in contact with the wafer 3. At this time, the vacuum chuck mechanism 15 in the chuck 2 is activated, and the wafer 3 is chucked by the chuck 2.

The following is a wafer attachment/detachment sequence in a wafer replacement process. Let ΔZ be the distance from the lowest position to the replacement position of the pin unit 30. (1) The pin unit 30 is raised by the direct drive motor 22. (2) The wafer is removed from the chuck 2 and is chucked on the wafer pin 10 by switching the operations of the vacuum chuck mechanism 15 in the chuck 2 and the vacuum mechanism 11 in the wafer pin 10. (3) The wafer and the pin unit 30 are further raised to be located at the replacement position (see FIG. 5). (4) The hand mechanism 203 is inserted between the wafer and the chuck 2 without contacting them, thereby replacing the wafer. (5) The replaced wafer is positioned by the direct drive motor 22 while the wafer position is measured by the wafer surface focus measuring instrument 202 for pre-alignment. (6) pre-alignment is performed by 5 rotating the pin unit 30. (7) The pin unit 30 is lowered by the direct drive motor 22. (8) The wafer is removed from the wafer pin 10 and chucked on the chuck 2 by switching the operations of the vacuum mechanism 11 in the wafer pin 10 and the vacuum chuck mechanism 15 in the chuck 2. (9) The pin unit 30 is lowered to the lowest position.

SUMMARY OF THE INVENTION

The following problems to be solved, however, are posed in the above apparatus. (1) Owing to the presence of the lift mechanism 32 including the direct drive motor 22, the space occupied by the tilt stage 1 is large, and a total height H of the tilt stage 1 is large. In addition, with the addition of the lift mechanism 32, the weight of the wafer stage apparatus 100 increases to adversely affect the horizontal positioning characteristics of the stage. (2) When the pin unit 30 is lowered after pre-alignment of a wafer, the wafer is located outside the measurement range of the wafer surface focus measuring instrument 202. Therefore, in order to mechanically maintain the rotation position of the wafer, the mechanical precision of the rotating mechanism 31 including the gear must be improved.

It is an object of the present invention to realize a simple, low-profile, lightweight stage 5 apparatus and improve the substrate attachment/detachment precision.

In order to achieve the above object, a stage apparatus of the present invention comprises:

- a movable stage which is movable on an X-Y plane;
- a substrate stage mounted on the movable stage to be movable at least in the Z-axis direction;
- a substrate chuck which is arranged on the substrate stage and holds a substrate; and
- substrate support means which is brought into contact with the substrate on the chuck and receives the substrate when the substrate stage moves in the Z-axis direction.

According to this characteristic feature of the present invention, attachment/detachment of a substrate between the substrate chuck and the substrate support means in a substrate replacing operation can be performed by only moving the substrate chuck. Therefore, the means for moving the substrate support means can be omitted. If this means is not arranged, a simple, low-profile, lightweight stage apparatus can be realized. In addition, since the substrate support means need not move in the Z-axis direction or its moving amount can be minimized in a substrate replacing operation, high precision of alignment of a wafer on the substrate support means can be easily maintained. In addition, the substrate is maintained at an almost constant Z-axis position so that the substrate can be held within the measurement range of the measuring means. If the characteristic feature of the present invention is added to the apparatus shown in FIG. 5, the moving amount of the substrate support means (wafer pin 10) can be reduced as compared with the apparatus in FIG. 5. Therefore, the moving mechanism in this arrangement can be made smaller in size than that in the apparatus shown in FIG. 5.

DETAILED DESCRIPTION OF THE PREFERRED EMBODIMENT

Figure 1:
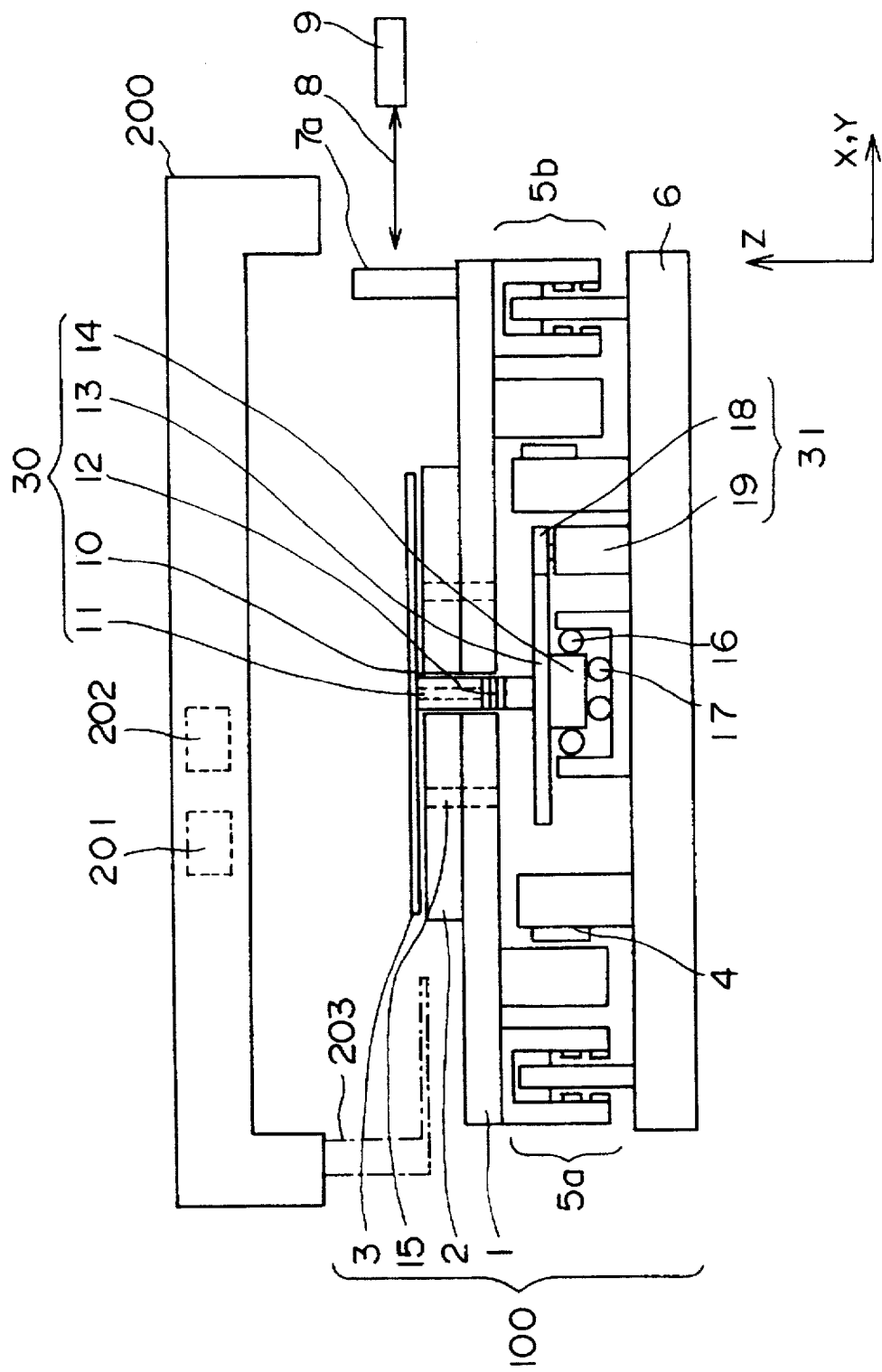
FIG. 1 is a sectional view showing a semiconductor exposure apparatus having a stage apparatus according to an embodiment of the present invention.

FIG. 1 is a sectional view showing a semiconductor exposure apparatus including a wafer stage according to an embodiment of the present invention. This semiconductor exposure apparatus consists of a wafer stage apparatus 100 and a main body apparatus 200. The Z-axis is the exposure optical axis direction, and the X-Y plane is perpendicular to the exposure optical axis. The wafer stage apparatus 100 is mainly constituted by a tilt stage 1 and an X-Y stage 6. A chuck 2 is fixed to the tilt stage 1. The chuck 2 has an intra-chuck vacuum chuck mechanism 15 and serves to mount a wafer 3. A guide 4 restricts only the horizontal movement of the tilt stage 1. For example, with the use of a static pressure bearing, the guide 4 allows movement of the tilt stage 1 in the Z direction, the inclination direction (the rotation direction with respect to the X- or Y-axis as a rotation axis), and the Z-axis rotation direction. The position of the tilt stage 1 in the Z direction as the gravity direction with reference to the X-Y stage 6 or the inclination of the tilt stage 1 can be automatically controlled at a high speed by noncontact driving of a plurality of Z linear motors 5 (5a and 5b). The X-Y stage 6 can be translated (along the X-Y plane) with respect to the main body apparatus 200 by a driving means such as a linear motor or a ball screw. A laser interferometer 9 can accurately measure the X-direction, Y-direction, and Z-axis-rotation-direction positions of a position measuring mirror 7a arranged on the tilt stage 1. The tilt stage 1 can be positioned in the X, Y, and Z-axis rotation directions with high precision by driving the X-Y stage 6 using the laser interferometer 9.

A wafer pin 10 incorporates an intra-wafer-pin vacuum mechanism 11. A secondary gear 13 and a pin bearing 14 are arranged under the wafer pin 10. The wafer pin 10, the secondary gear 13, and the pin bearing 14 are fixed to each other to constitute a pin unit 30. The pin unit 30 can move in the Z-axis rotation direction with respect to the X-Y stage 6 via a ball bush 16 and a thrust ball bush 17. In addition, a PZT mechanism 12 capable of slightly expanding/contracting in the Z direction is mounted on the wafer pin 10.

A rotating mechanism 31 is constituted by a motor 19 and a primary gear 18 rotated thereby. The motor 19 drives the pin unit 30 in the Z-axis rotation direction via the primary gear 18 and a secondary gear meshed therewith.

The main body apparatus 200 includes a wafer surface focus measuring instrument 201 used in a wafer exposure process, a wafer surface focus measuring instrument 202 used for pre-alignment after wafer replacement, and a hand mechanism 203 operated for wafer replacement.

Figure 2:
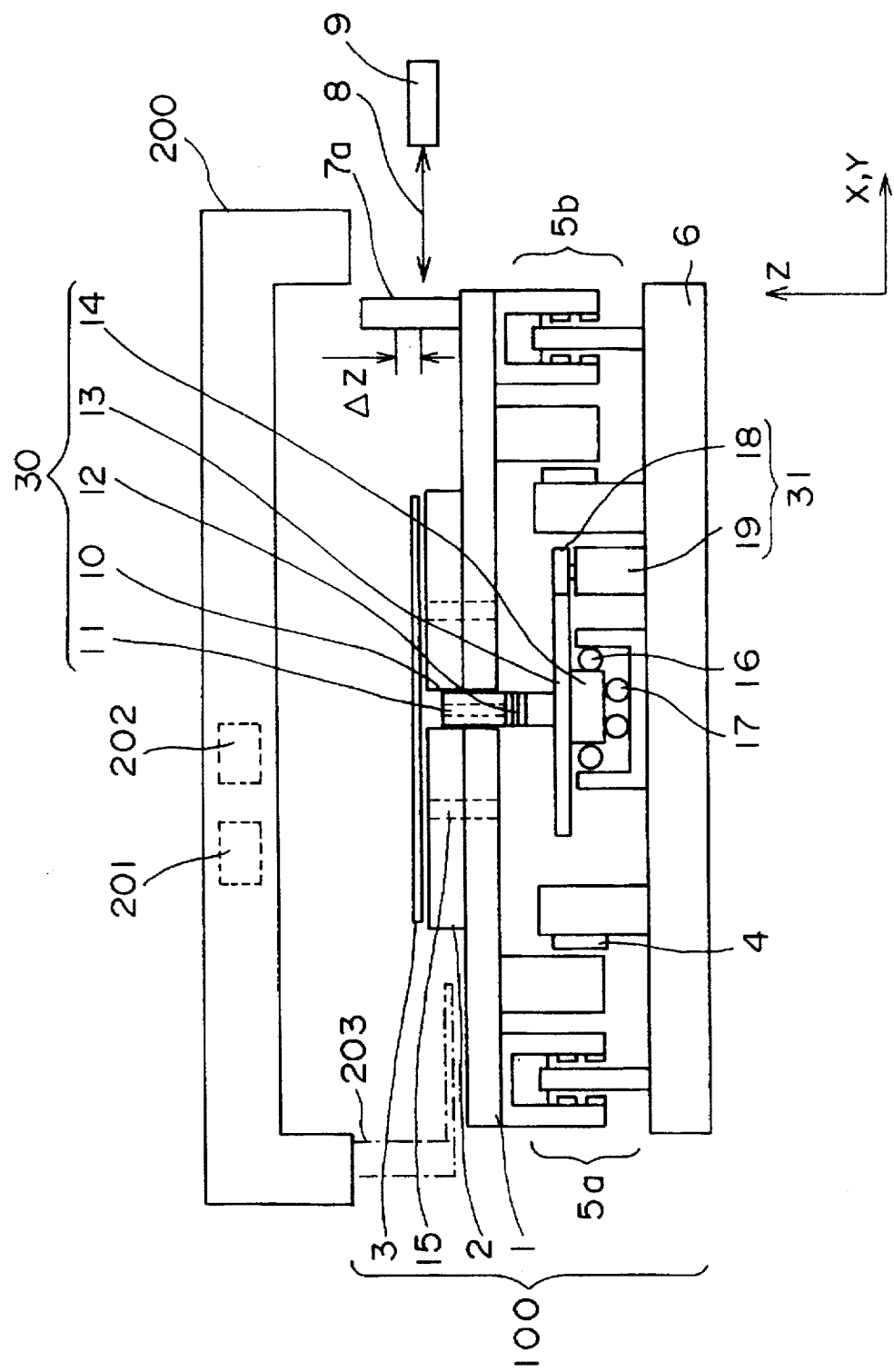
FIG. 2 is a sectional view showing a state wherein a wafer exposure process is performed in the embodiment.

FIG. 2 is a sectional view showing a state wherein 10 a wafer exposure process is performed by the apparatus shown in FIG. 1. In an exposure process, the tilt stage 1 is located near the highest position. The intra-chuck vacuum chuck mechanism 15 is activated, and a wafer is chucked on the chuck 2. At this time, the wafer pin 10 is not in contact with the wafer. The thickness irregularity or inclination of the wafer is corrected by driving a plurality of Z linear motors while measuring the wafer surface position using the wafer surface focus measuring instrument 201.

A wafer replacing operation will be described next. Let $\Delta Z$ be the distance between the highest and lowest positions of the tilt stage 1. Even if the tilt stage 1 moves in the Z direction by $\Delta Z$ with respect to the X-Y stage 6, the bearing function of the static pressure bearing in the guide 4 is guaranteed. In addition, the length of the position measuring mirror 7a is set to be large to prevent the position measuring mirror 7a from being shifted from the optical axis of the laser interferometer 9 even if the tilt stage 1 moves in the Z direction by $\Delta Z$ with respect to the X-Y stage 6.

Figure 3:
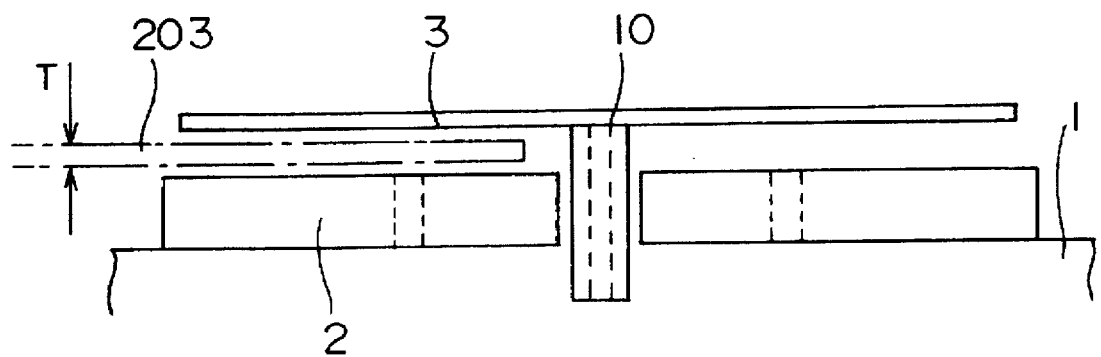
FIG. 3 is a sectional view for explaining how wafer replacement is performed in the embodiment.

The following is a wafer attachment/detachment sequence in a wafer replacement process. (1) The Z linear motors 5 (5a and 5b) are simultaneously driven to lower the tilt stage 1. (2) The wafer is removed from the chuck 2 and chucked on the wafer pin 10 by switching the operations of the intra-chuck vacuum chuck mechanism 15 and the intra-wafer-pin vacuum mechanism 11. (3) The tilt stage 1 is lowered to the lowest position where a sufficient gap is ensured between the chuck 2 and the wafer (see FIG. 1). (4) The hand mechanism 203 is inserted between the wafer and the chuck 2 without contacting them, thereby replacing the wafer. At this time, as shown in FIG. 3, the gap between the wafer 3 and the chuck 2 is larger than the thickness of the hand mechanism 203. (5) The wafer position is measured by the wafer surface focus measuring instrument 202 for pre-alignment. (6) A PZT mechanism 12 is driven by a small amount to position the wafer at the pre-alignment focus position. (7) The motor 19 is driven to rotate the wafer so as to perform pre-alignment. (8) The Z linear motors 5 (5a aand 5b) are driven to raise the tilt stage 1. (9) The wafer is removed from the wafer pin 10 and chucked on the chuck 2 by switching the operations of the intra-chuck vacuum chuck mechanism 15 and the intra-wafer-pin vacuum mechanism 11. (10) The thickness irregularity or inclination of the wafer is corrected by driving the Z linear motors 5 (5a and 5b) while measuring the wafer surface by using the wafer surface focus measuring instrument 201.

This embodiment may be variously modified as follows:

(1) In the above embodiment, the noncontact linear motors 5 (5a and 5b) are used to drive the tilt stage 1 in the Z direction. However, a direct drive motor with a ball screw may be used instead of the linear motors 5 (5a and 5b).

(2) Although the static pressure bearing is used to restrict the horizontal movement of the tilt stage 1 with respect to the X-Y stage 6, a leaf spring may be used instead of the static pressure bearing. However, the amount of deformation of the tilt stage 1 caused by a reaction force from the leaf spring when the tilt stage 1 moves by $\Delta Z$ must be equal to or smaller than an allowable amount.

(3) In the above embodiment, the PZT mechanism 12 is incorporated in the pin unit 30 to perform a slight driving operation for focus positioning in a pre-alignment process. If, however, the wafer surface focus measuring instrument 202 has an auto-focus mechanism in a pre-alignment process, the PZT mechanism 12 is not required.

(4) If the hand mechanism 203 has a pre-alignment mechanism, the rotating mechanism 31 and the PZT mechanism 12 may be omitted.

Figure 4:
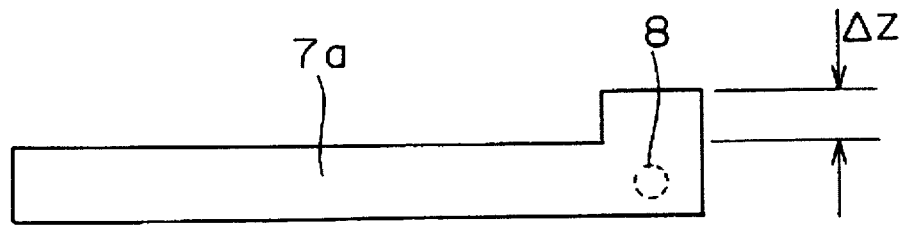
FIG. 4 is a sectional view for explaining a position measuring mirror which locally has a portion with a large height in the Z direction, and which can be used for the embodiment.
Figure 5:
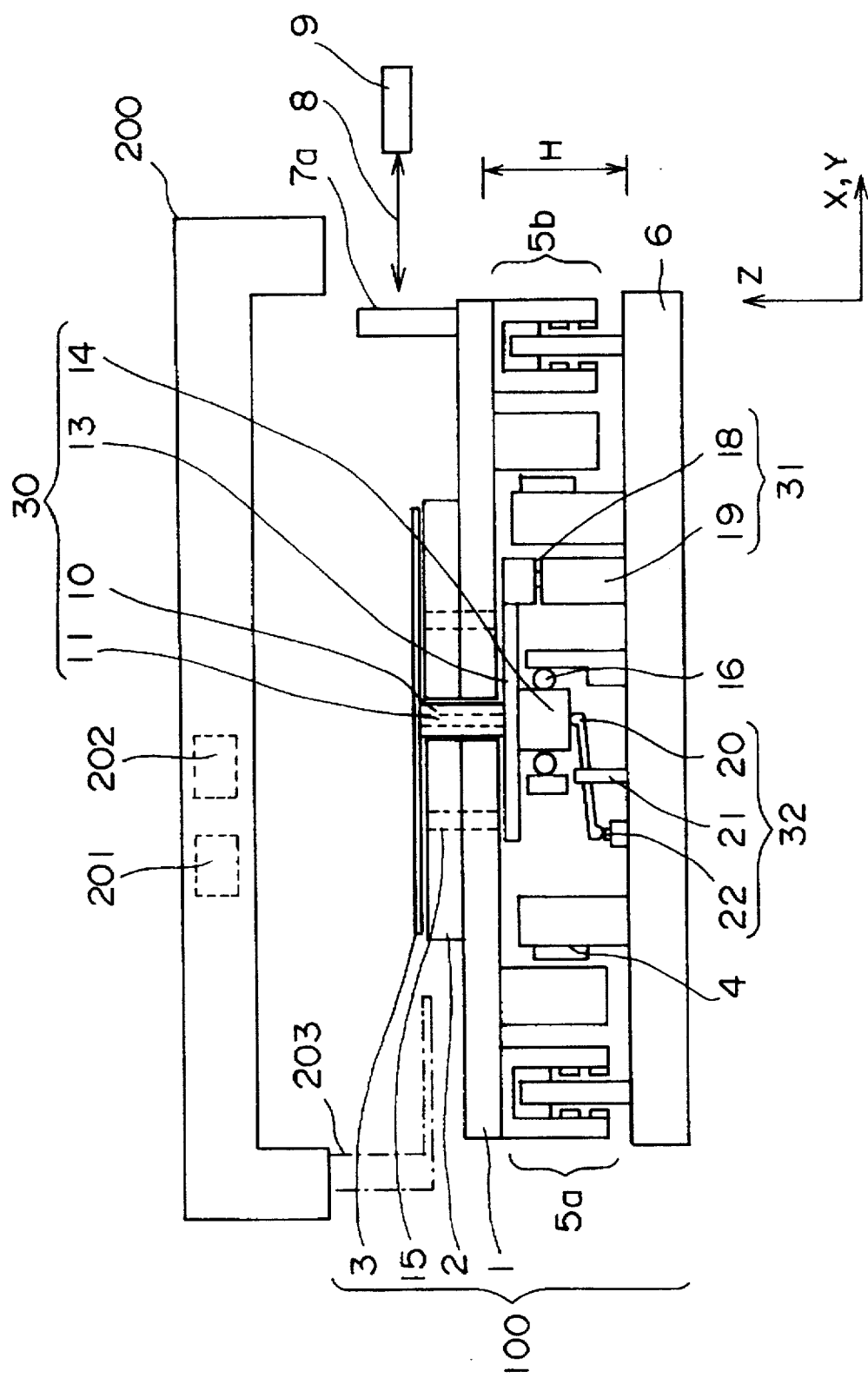
FIG. 5 is a sectional view showing a stage apparatus.

(5) The position measuring mirror 7a may have the arrangement shown in FIG. 4. FIG. 4 shows the position measuring mirror 7a viewed from the mirror surface side. That is, the apparatus may use a position measuring mirror designed such that a portion of the bar mirror which is located near the position where a beam 8 from the laser interferometer is irradiated is locally higher than the remaining portion by ΔZ or more at the horizontal position of the tilt stage 1 when the tilt stage 1 moves by ΔZ, as shown in FIG. 4.

What is claimed is:

1. A stage apparatus comprising:

A substrate chuck for holding a substrate;

an X-Y stage for moving said substrate chuck along an X-Y plane;

a Z stage disposed on said X-Y stage for moving said substrate chuck in a Z-direction with respect to said X-Y stage;

a reflecting mirror disposed on said Z stage and moved integrally with said substrate chuck in the Z-direction by said Z-stage;

a laser interferometer for measuring a position in the X-Y plane of said Z-stage moved along said X-Y plane by said X-Y stage by detecting laser light reflected by said reflecting mirror after the laser light is irradiated along an optical axis of said laser interferometer; and a supporting member for receiving the substrate from said substrate chuck by having said substrate chuck moved from a first position to a second position in the Z-direction by said Z stage and transferring the substrate to said substrate chuck by having said substrate chuck moved in the Z-direction from the second position to the first position, wherein at least one portion of said reflecting mirror has a width portion capable of reflecting the laser light irradiated along the optical axis of said laser interferometer in the Z-direction when said substrate chuck is at the first position and when said substrate chuck is at the second position.

2. An apparatus according to claim 1, wherein said Z stage causes said substrate chuck to incline with respect to the X-Y plane.

3. An apparatus according to claim 2, further comprising a plurality of linear motors for driving said Z stage.

4. An apparatus according to claim 1, further comprising a rotating mechanism for rotating said supporting member about a Z axis.

5. An apparatus according to claim 1, further comprising a moving mechanism for moving said support member in the Z-direction.

6. An apparatus according to claim 5, wherein said moving mechanism comprises a piezoelectric element.

7. An apparatus according to claim 1, wherein said substrate chuck and said supporting member each absorbingly holds the substrate by vacuum.

8. A method for fabricating a device on a substrate, comprising the steps of:

moving a substrate chuck and a reflecting mirror for a laser interferometer disposed on an X-Y stage, which move along an X-Y plane, from a first position to a second position in a Z-direction;

projecting a holding surface of a supporting member disposed on the X-Y stage from a holding surface of the substrate chuck by the motion of the substrate chuck from the first position to the second position in the Z-direction;

measuring a position of the substrate chuck on the X-Y plane by detecting laser light reflected by the reflecting mirror by way of the laser interferometer when the substrate chuck is at the second position;

disposing a substrate on the holding surface of the supporting member;

receiving the substrate on the holding surface of the supporting member on the holding surface of the substrate chuck by motion of the substrate from the second position to the first position in a Z-direction of the substrate chuck;

measuring a position of the substrate chuck on the X-Y plane by detecting laser light reflected by the reflecting mirror by way of the laser interferometer when the substrate chuck is at the first position;

absorbingly holding the substrate on the holding surface of the substrate chuck; and performing a process for fabricating a device for the substrate by moving the X-Y stage, and measuring the position of the substrate chuck on the X-Y plane by way of the laser interferometer.

9. A method according to claim 8, wherein at least one portion of the reflecting mirror has a width portion capable of reflecting the laser light used by the laser interferometer in the Z-direction when the substrate chuck is at the first position and when the substrate chuck is at the second position.

* * * * *

UNITED STATES PATENT AND TRADEMARK OFFICE
CERTIFICATE OF CORRECTION

PATENT NO. : 5,717,482
DATED : February 10, 1998
INVENTOR(S) : Kotaro AKUTSU, et al.

It is certified that error appears in the above-identified patent and that said Letters Patent is hereby corrected as shown below:

<u>TITLE PAGE, AT ITEM [75] (Inventors)</u>

"Kotarao Akutsu" should read --Kotaro Akutsu--.

<u>COLUMN 1</u>

Line 63, "10" should be deleted, and begin a new paragraph with "In".

<u>COLUMN 2</u>

Line 16, "5" should be deleted; and
Line 40, "5" should be deleted.

UNITED STATES PATENT AND TRADEMARK OFFICE
CERTIFICATE OF CORRECTION

PATENT NO. : 5,717,482
DATED : February 10, 1998
INVENTOR(S) : Kotaro Akutsu, et al.

It is certified that error appears in the above-identified patent and that said Letters Patent is hereby corrected as shown below:

COLUMN 3

Line 12, begin a new paragraph with "FIG. 2";
Line 14, begin a new paragraph with "FIG. 3"; and
Line 16, begin a new paragraph with "FIG. 4".

COLUMN 4

Line 6, "10" should be deleted.

Signed and Sealed this

Thirteenth Day of July, 1999

Attest:

Q. TODD DICKINSON

Attesting Officer

Acting Commissioner of Patents and Trademarks